US006552606B1

(12) United States Patent
Veltman et al.

(10) Patent No.: US 6,552,606 B1
(45) Date of Patent: Apr. 22, 2003

(54) AMPLIFIER CIRCUIT HAVING OUTPUT FILTER CAPACITANCE CURRENT FEEDBACK

(75) Inventors: André Veltman, Culemborg (NL); Hendrikus Johannes Jacobus Domensino, Best (NL)

(73) Assignee: Technische Universiteit Eindhoven, Eindhoven (NL)

( * ) Notice: Subject to any disclaimer, the term of this patent is extended or adjusted under 35 U.S.C. 154(b) by 0 days.

(21) Appl. No.: 09/869,936

(22) PCT Filed: Jan. 12, 2000

(86) PCT No.: PCT/NL00/00016
§ 371 (c)(1),
(2), (4) Date: Oct. 5, 2001

(87) PCT Pub. No.: WO00/42702
PCT Pub. Date: Jul. 20, 2000

(30) Foreign Application Priority Data

Jan. 12, 1999 (NL) .............................................. 1011002

(51) Int. Cl.[7] .............................................. H03F 3/38
(52) U.S. Cl. ...................................... 330/10; 330/251
(58) Field of Search ............................. 330/10, 207 A, 330/251

(56) References Cited

U.S. PATENT DOCUMENTS

| | | | |
|---|---|---|---|
| 3,294,981 A | 12/1966 | Bose | 327/306 |
| 5,160,896 A | 11/1992 | McCorkle | 330/251 |
| 5,606,289 A | 2/1997 | Williamson | 330/297 |
| 5,949,282 A | * 9/1999 | Nguyen et al. | 330/10 |
| 6,064,259 A | * 5/2000 | Takita | 330/10 |

FOREIGN PATENT DOCUMENTS

| | | |
|---|---|---|
| DE | 3939616 A1 | 7/1990 |
| EP | 0 184 280 | 6/1986 |

OTHER PUBLICATIONS

Bowhers, et al., "Design of an Integrated ATE Amplifier", Boston University, pp. 745–748, (1994).

* cited by examiner

Primary Examiner—Robert Pascal
Assistant Examiner—Khanh Van Nguyen
(74) Attorney, Agent, or Firm—Finnegan, Henderson, Farabow, Garret & Dunner, L.L.P.

(57) ABSTRACT

An amplifier circuit (11) for amplifying electric signals, comprising controllable switching means (2) for generating a block wave signal whose amplitude varies between first and second supply voltage values during operation, filter means (9) for filtering the block wave signal so as to produce an output signal (10). The filter means (9) comprise a self-inductance (16) and a capacitance (17). The amplifier circuit (11) furthermore comprises modulating means (3) for pulse width modulation of the block wave signal by driving the switching means (2) in response to an input signal (16) to be amplified, and correction means (12) for providing from a reference value ($U_{ref}$) derived from the input signal and an output signal value proportional to the output signal (10) a correction signal for controlling the modulating means (3). In order to correct for interferences in the output signal (10), means (13) are provided for deriving a reference current ($I_{ref}$) from the input signal (6) as well as means (8) for providing a filter capacitance current proportional to the current though the filter capacitance (17). The correction means (12) are arranged for providing a current correction signal from the reference current ($I_{ref}$) and the filter capacitance current (18).

25 Claims, 10 Drawing Sheets

AMPLIFIER CIRCUIT HAVING OUTPUT FILTER CAPACITANCE CURRENT FEEDBACK

BACKGROUND OF THE INVENTION

The invention relates to an amplifier circuit for amplifying electric signals, comprising controllable switching means for generating a block wave signal whose amplitude varies between first and second supply voltage values during operation, filter means for filtering said block wave signal so as to produce an output signal, which filter means comprise a self-inductance and a capacitance, means for providing a filter capacitance current proportional to the current through the filter capacitance, modulating means for pulse width modulation of the block wave signal by driving the switching means in response to an input signal to be amplified, and correction means for providing from a reference value derived from the input signal and an output signal value proportional to the output signal a correction signal for controlling the modulating means.

An amplifier circuit of this kind is disclosed in U.S. Pat. No. 5,606,289, in practice also known as a so-called class D amplifier.

In a class D amplifier circuit a block wave signal is generated which has a frequency which is much higher than the highest frequency of the input signal to be amplified. The pulse width ratio of this signal is modulated so that the average value of the block wave signal is proportional to the input signal. By applying the block wave signal to a low-pass filter or resonator circuit, with a cut-off frequency ranging between the highest signal frequency and the frequency of the block wave signal, an output signal is produced from which the switching frequency or block wave frequency and higher frequencies of the block wave signal have been removed. The output signal represents the average value of the block wave signal, and consequently of, the input signal, which is amplified, however, by an amplification factor which is determined by the electrical characteristics of the modulator, the correction signal, the supply source and the switching means. Usually, switching transistors such as MOSFET's (Metallic Oxide Semiconductor Field Effect Transistors) are used as the switching means.

Linear amplifiers, such as class A and class AB amplifiers, for example, whose amplifier stage is essentially operated as a controllable series resistor, have a very low energetic efficiency, since a high heat dissipation occurs in the output stage when the amplifier is not driven to full load. An amplifier circuit comprising a switched output stage, on the other hand, such as the amplifier circuit according to the invention, only exhibits a small degree of heat dissipation, since the current through the output stage is zero when the switching means are off, and the voltage across the output stage is practically zero when the switching means are on. Switching amplifiers, or class D amplifiers, have a very high energetic efficiency, >90% in practice.

In practice a number of undesirable effects occur in switching amplifiers, which cause interferences of the ideal output signal. The interferences can be subdivided into internal errors and external errors.

The output impedance of the amplifier is mainly determined by the filter means for filtering out the block wave signal. This impedance is frequency dependent, and is for practical reasons approximately equal to the nominal load resistance at the end of the frequency band. Accordingly, interferences in the output signal due to external causes are hardly suppressed in the signal that is applied to the load. Furthermore, a load impedance-dependent frequency transfer will occur.

Furthermore, switching transistors, for example, have a limited response time, which is mainly caused by parasitic capacitances. Transistors connected in a so-called half-bridge circuit, wherein two switching transistors are arranged in series and the block wave signal is generated at the junction of the transistors, must never be "on" simultaneously, since a current path from the positive supple terminal to the negative supply terminal will be formed in that case. The current that occurs during such a short circuit will undoubtedly cause damage to the switching transistors. For this reason a so-called "dead time" is maintained during the switching of the transistors, in order to ensure that at least one of the transistors will be "off". Especially at small amplitudes this dead time causes a strong non-linearity in the signal transfer of a loaded amplifier circuit.

Finally, depending on the type of modulating means, interferences which are present on the supply voltage can be transferred to the output signal.

Both the output impedance caused by the output filter and the non-linearity resulting from the dead time and interferences on the supply voltage can be reduced as much as possible with the prior art switching amplifier circuits, provided they are adequately designed, by means of the correction signal in a closed loop feedback to the modulating means. It has been found, however, that the maximum suppression that can be realised is not adequate due to the output filter impedance/phase shift. Moreover, the stability condition may depend on the load and the supply voltage.

Accordingly, it is a first object of the invention to provide enhanced suppression of interferences in the output signal of a class D amplifier circuit caused by internal and external error sources by eliminating the influence of the output filter on the signal transfer characteristics of the amplifier circuit.

SUMMARY OF THE INVENTION

In accordance with the invention, this objective is accomplished by providing means for deriving a reference current from the input signal, wherein the correction means are arranged for providing the correction signal as a current correction signal from the reference current and the filter capacitance current.

The invention is based on the insight that an adequate differential correction is necessary in order to effect a quick correction of interferences in the output signal, to which end the invention advantageously makes use of the filter capacitance current, which is proportional to the derivative of the output signal voltage of the amplifier circuit, without the drawbacks of high-frequency noise and other interferences that occur when separate differentiating means are used for providing a D correction signal.

By placing the output filter within the control loop in accordance with the invention, the impedance of the output filter of an amplifier which is controlled in this manner will hardly result in an output impedance of the amplifier, if at all. A change in the load of the amplifier circuit will directly be detected and corrected, since the change in the filter capacitance current caused by said change in the load will immediately result in the generation of a current correction signal.

In a preferred embodiment of the invention the object is to minimise such interferences as quickly as possible, preferably within one switching period of the switching means. To this end the means for providing the filter capacitance current are wideband means, that is, comprising on average five times the signal bandwidth of the amplifier or higher.

Basically, there are two possibilities for measuring the filter capacitance current. In the case of direct measurement, a sensor or other electric component, such as a resistor, is connected in series with the filter capacitor. In the case of indirect measurement, the current is provided by a capacitor which is connected in parallel with the filter capacitance. The advantage of direct measurement is that the current through the filter capacitor can be represented with maximum accuracy and without any appreciable phase shift.

In a further embodiment of the invention, in order to provide a filter capacitance current which is maximally proportional to the current through the filter capacitance, the means for providing the filter capacitance current comprise a current transformer which is connected in series with the filter capacitance or with part thereof, which current transformer is built up of a core having a coaxial cable wound thereon, one conductor of which, for example the inner conductor, is connected in series with the filter capacitance, whilst a filter capacitance current proportional to the current through the filter capacitance is generated in the other conductor, the outer conductor of the coaxial cable.

The filter capacitance current and the reference current do not contain any information with respect to possible direct current (DC) components in the signal to be amplified. Accordingly, a preferred embodiment of the amplifier circuit according to the invention in the form of a voltage amplifier comprises a voltage correction signal in addition to a current correction signal.

In yet another embodiment of the amplifier circuit according to the invention, the correction signals are thus processed into one control signal for the modulating means in that the correction means comprise a first differential circuit for providing a first difference signal from the reference voltage and the output voltage signal, a second differential circuit for providing a second difference signal from the reference current and the filter capacitance current, a Proportional (P) or Proportionally Integrating (PI) control circuit including an input for the first difference signal, a control circuit including an input for processing the second difference signal by a factor (D) and a summing circuit for summing an output signal of the P or PI control circuit and an output signal of the D control circuit for controlling the modulating means.

This embodiment enables the control system to respond quickly and adequately, via the current feedback loop, to current variations on the output of the amplifier circuit, wherein the voltage feedback ensures that the system will follow the desired output level in the low-frequency range as well. In practice it has been found that the filter capacitance current responds to an insufficient degree in the low-frequency range, because the first order derivative is too small when signal frequencies are low, so that the voltage feedback loop must be designed to be operative at least in the low-frequency range of approximately <500 Hz.

In the prior art a comparator circuit is generally used as the modulating means, the inputs being a triangular (or saw-toothed) voltage and the signal to be amplified with the possible addition of a correction signal. This technique is known as "sine-triangle" modulation. In the case of sine-triangle modulation, the modulating means may cause relatively very narrow pulses when the amplifier is driven to a high degree of output, which narrow pulses may be harmful to semiconductor switching transistors. In addition to that, errors are introduced as a consequence of the dead time that is necessary. Errors of this type can be characterized as internal errors of the amplifier circuit. In addition to that, the output voltage of the sine-triangle modulator is proportional to the supply voltage being applied, which can be considered to be an external error.

Besides the sine-triangle modulation principle, also the "sigma-delta" modulation principle, which is not used very frequently in class D amplifiers, is suitable for use in an amplifier circuit according to the invention. In accordance with the sigma-delta modulation principle, the modulating means comprise a hysteresis control circuit. In contrast to sine-triangle modulators, the switching frequency of the switching means may vary under the influence of supply voltage and signal fluctuations with the sigma-delta modulation principle.

In a preferred embodiment of the invention, the modulating means comprise a hysteresis control circuit which functions to make it possible to vary the switching frequency of the switching means, which is not possible with the switching amplifiers which are known from the prior art. Basically, the switching frequency is free when using the hysteresis control circuit according to the invention, and it will vary with the supply voltage and the output voltage and output current without any further control. The switching frequency must be prevented from becoming too low in relation to the highest frequency of the input signal that is permissible, because this will result in an undesirably large switching ripple in the output signal.

In principle, interferences in the output signal of the amplifier circuit according to the invention are equalized within one, albeit extended, switching period. Consequently, an increased speed of response is obtained by dropping the principle of a fixed switching frequency, which makes it possible to realise a lower output impedance of the amplifier circuit.

In order to have the amplifier circuit operate at a desired average switching frequency, another embodiment of the invention has been configured with frequency control by providing the hysteresis control circuit with a control input for controlling its hysteresis window in response. The width of the hysteresis window determines the (average) switching frequency of the system, without affecting the characteristics as regards the elimination of interferences as described above, however.

Another advantage of using a hysteresis control circuit in the amplifier circuit according to the invention is that the integrating means required for the sigma-delta modulation principle, which integrate the difference between the output signal of the amplifier circuit and a desired value, are already implicitly present in the form of the filter inductance of the output filter, whose current is after all the integral of the difference between the block wave voltage of the switching means and the output voltage of the amplifier. The current through the filter inductance is partially available in the filter capacitor current, of course, a representation of which is according to the invention compared to a desired value of the reference current derived from the input signal and supplied to the hysteresis control circuit as a correction signal.

The advantage of the incorporation of the integrating means with the output filter that has to be present, is that interferences can be quickly minimized, preferably, as desired, within one switching period of the switching means.

Besides an embodiment in the form of a voltage amplifier, it is also possible to realise an embodiment in the form of an amplifier comprising a so-called current output. With such a current amplifier at least two of the three currents, viz. the filter self-inductance current, the filler capacitance current and/or the output signal current must be measured.

One embodiment of a current amplifier according to the invention comprises means for providing a filter self-inductance current proportional to the current through the filter self-inductance, means for providing an output current signal proportional to the output signal current, wherein the correction means comprise a first differential circuit for providing a first difference signal from the reference current and the output current signal, a control circuit including an input for the first difference signal and an input for an output voltage signal proportional to the output signal voltage, and a summing circuit for summing an output signal from the control circuit and a current value proportional to the filter self-inductance current for controlling the modulating means.

In the embodiment in question, the filter capacitance current is implicitly derived from the measurement of the filter self-inductance current and the output current signal.

The principle of the amplifier circuit according to the invention can be used both with a so-called half-bridge circuit, wherein a supply source having a positive and a negative voltage value relative to a zero point is available, and with a so-called fill bridge or H-bridge circuit both in the so-called (complementary mode controlled) "2-level" mode and in "3-level" mode. In the latter case an amplifier circuit built up of a first and a second amplifier circuit comprising a half-bridge circuit may be provided, wherein according to an embodiment of the invention the reference voltage and the reference current at the second amplifier circuit are processed in reverse phase compared to the first amplifier circuit.

In order to optimally eliminate interferences this amplifier circuit, which is connected as a full-bridge or H-bridge circuit, is according to the invention provided with a common hysteresis control circuit including a first and a second controllable hysteresis window for the first and the second amplifier circuit, wherein the hysteresis control circuit is controlled by means of a control signal comprising a differential term and a common term, wherein the differential term controls the desired phase difference between the first and the second amplifier circuit and the common term controls the average switching frequency of the first and the second amplifier circuit.

It is important thereby that the hysteresis control causes the phase of the pulses of the two bridge branches to be set exactly so that the double switching frequency is achieved on the output when the output signal is not equal to zero. A major advantage of this so-called "3-level" mode is that there will be absolutely no switching ripple between the two outputs of the bridge branches when there is no input signal.

In circuits which are used in practice it is difficult to prevent the block wave-like output signal of the switching means comprising a common component in addition to the desired differential component. This is caused, among others, by small time differences in the modulation signals from the switching means. By suitably distributing the self-inductance of the output filter over the two bridge outputs and magnetically coupling the filter coils, it is possible to realise different inductances for the differential and the common (in-phase or "common-mode") signal components.

In another embodiment of the amplifier circuit according to the invention this has been realised in that the filter means for filtering the block wave signal of the full-bridge or H-bridge circuit comprise a self-inductance built up of an essentially 8-shaped core having a first and a second outer leg, each provided with a winding, and a central leg, which central leg has a higher magnetic resistance than the two outer legs, wherein the winding on the first outer leg is connected to the junction of the first and the second switching transistor and the winding on the second outer leg is connected to the junction of the third and the fourth switching transistor, in such a manner that an in-phase or common mode signal from the bridge circuit generates a magnetic field in the two outer legs of the core and in that a reverse phase signal from the bridge circuit generates a magnetic field through the central leg.

By using different capacitance values for the filter capacitance of the output filter, adapted to the realised inductance distribution, for the differential path and the common path as well, thus realising a low pass bandwidth for the common component in the output filter, this component can be further effectively suppressed.

In yet another embodiment of the invention a further improvement, in particular as regards the noise behaviour of the amplifier circuit, is achieved in that the differentiating means for forming the reference current and anti-aliasing input filter means are combined into one circuit on the input side, said circuit comprising a first differential amplifier including an input for connecting the input signal from the amplifier circuit and an output to which a low pass filter is connected, a second differential amplifier connected in cascade with the low pass filter as an integrator, which includes an output for supplying the reference voltage, and a third differential amplifier connected to the low pass filter for supplying the reference current.

The amplifier circuit according to the invention is excellently suitable for use as the output stage in an audio amplifier, but it can also be used advantageously in a power amplifier for precise measurement and control purposes, such as servo amplifiers having extremely high values for the product of power and bandwidth.

BRIEF DESCRIPTION OF THE DRAWINGS

The invention will be explained in more detail hereafter with reference to the appended drawings, which show a preferred embodiment of the invention.

DETAILED DESCRIPTION OF THE INVENTION

Elements or components which are indicated by the same numerals throughout the various embodiments have an identical or equivalent function.

Figure 1:
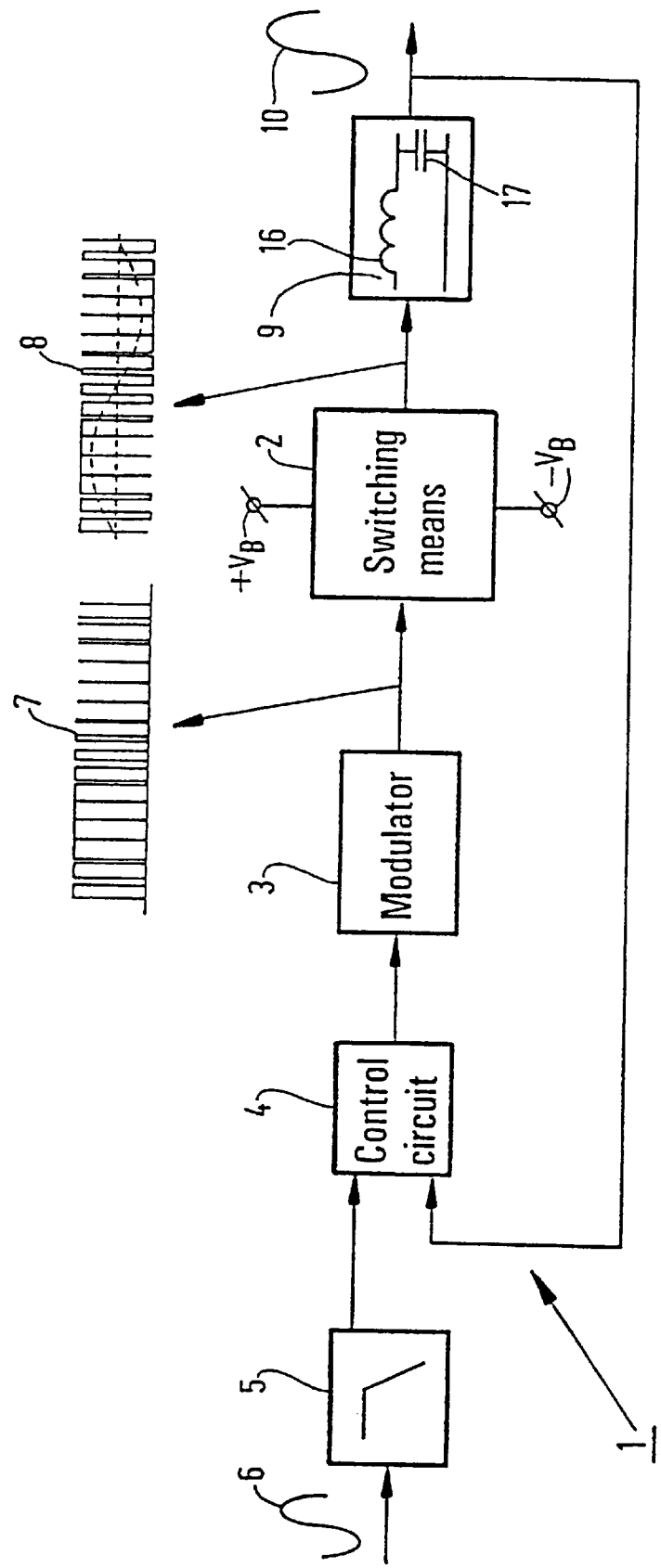
FIG. 1 is a block diagram wherein the main components of a typical class D amplifier are shown.

FIG. 1 shows in a general block diagram the principle of a switching amplifier or class D amplifier 1. Amplifier 1 comprises a switching stage 2 consisting of controllable switching means, such as switching transistors. Generally, so-called MOSFET's (Metallic Oxide Semiconductor Field Effect Transistors) are used for this purpose. Two switching transistors are connected in series in a so-called half-bridge circuit between a first (positive) supply voltage value $+V_B$ and a second (negative) supply voltage value $-V_B$. The switched signal is taken from the junction of the two transistors. When no positive or negative supply voltage values are available, a so-called full-bridge of H-bridge circuit can be used, wherein two half-bridge circuits are connected in parallel between a first (positive) supply voltage value $+V_B$ and a second (zero) supply voltage value. The switched signal will be taken between the junctions of the two bridge branches in that case. Another possibility is the so-called H-bridge circuit comprising two complementary mode controlled branches. As regards waveforms and functionality, this circuit produces a result which is comparable to that of the half-bridge circuit, with this H-bridge circuit, however, half the supply voltage will be sufficient.

The switching means 2 are controlled by modulating means 3. The modulating means 3 usually comprise a comparator circuit having two stable (binary) output states. An oscillator signal, which is generally triangular or sawtoothed, is applied to a first input of the comparator circuit in that case, and the input signal to be amplified is applied to a second input. The binary output state of the comparator circuit indicates whether the input signal to be amplified is larger or smaller than the oscillator signal.

Consequently, the output signal from the modulating means 3 is a pulse wave shaped control signal 7, whose pulse width ratio is modulated by the input signal 6 in such a manner that the average value of the pulse wave shaped signal 7 is proportional to the input signal 6. This modulation principle is known as so-called "sine-triangle" modulation.

When the switching means 2 are driven by means of the control signal 7, a block wave signal 8 ranging between the first and the second supply voltage values is produced. By means of output filter means 9, generally a passive low pass filter consisting of a self inductance 16 and a capacitance 17, an output signal 10 is eventually obtained which is equal with the input signal 6, amplified by a total amplification factor G, however. The output filter means 9 (also called resonating means) provide for the removal of the switching or block wave frequency and higher frequencies from the switched block wave signal 8 of the switching means 2.

Theoretically, sampling of the input signal 6 is carried out by the modulating means 3 at a frequency determined by the oscillator signal from the modulating means 3. As already known, this leads to aliasing when the sampling frequency is lower than twice the highest frequency in the sampled signal. In order to prevent undesirable distortions in the output signal 10 resulting from the aliasing effect as much as possible, the input signal 6 is generally applied to a so-called anti-aliasing input filter 5 first, which limits the input signal 6 applied to the control means 4 as regards its frequency so that no aliasing will occur in the output signal of the modulating means 3.

Besides sine-triangle modulation, also the so-called "sigma-delta" modulation principle is used. According to the sigma-delta modulation principle, the modulating means comprise a hysteresis control circuit. Furthermore an integrating component is required, which integrates the difference between the output voltage of the switching means and a desired value. This integrated signal is in turn applied to an input of the hysteresis control circuit.

As already mentioned in the introduction, the two switching transistors of a bridge branch must not be "on" at the same time, as this would result in a short-circuit path for the supply voltage. The time required for switching one transistor of a bridge branch "off" and subsequently switching the other transistor "on" is called the dead time. This dead time results in non-linearities in the transfer function of the amplifier circuit 1.

In the case of sine-triangle modulation, the modulating means may cause very narrow pulses when the amplifier is driven to a high degree of output, which narrow pulses may be harmful to the switching transistors. Furthermore, the output voltage of the sine-triangle modulator varies proportionally to the supply voltage being applied.

The sigma-delta modulator distinguishes itself from the sine-triangle modulator by a smaller dead time error, the virtual absence of supply voltage dependency in the output signal and an excellent "clip" behaviour, that is, no narrow pulses. In contrast to sine-triangle modulators, the switching frequency of the switching means can vary under the influence of supply voltage and signal fluctuations, provided no additional frequency-stabilizing measures are taken. It should be noted thereby that the switching frequency does not influence the linearity of the amplifier, but only the amplitude of the ripple voltage on the output.

The output impedance of a class D amplifier is mainly determined by the output filter means 9 for filtering out the block wave signal. This impedance is frequency-dependent, and for practical reasons it is approximately equal to the nominal load resistance at the end of the frequency band of the amplifier circuit. As a result of this, a load impedance-dependent frequency transfer is obtained, wherein for example the turning on and off of a load connected to the amplifier circuit will also lead to variations in the output signal 10.

In order to equalize disturbances in the output signal 10 caused by supply voltage variations, load variations and the necessary dead time in the switching means, control means 4 are provided. These control means produce a control signal, which is applied to the modulating means 3 for varying the switching moment of the switching means 2. The control signal from the control means 4 is provided from the input signal 6 and the output signal 10. Dead time problems and disturbances caused by supply voltage variations can effectively be suppressed by means of adequately adjusted control means 4.

Since the output filter means 9 exhibit a strong phase shift over the output frequency range of the amplifier circuit, it is not possible in practice, however, to design control means 4 wherein for example only the output voltage of the amplifier circuit is the correction signal by means of which an adequate suppression (that is, a low output impedance) can be realised at the higher frequencies.

Figure 2:
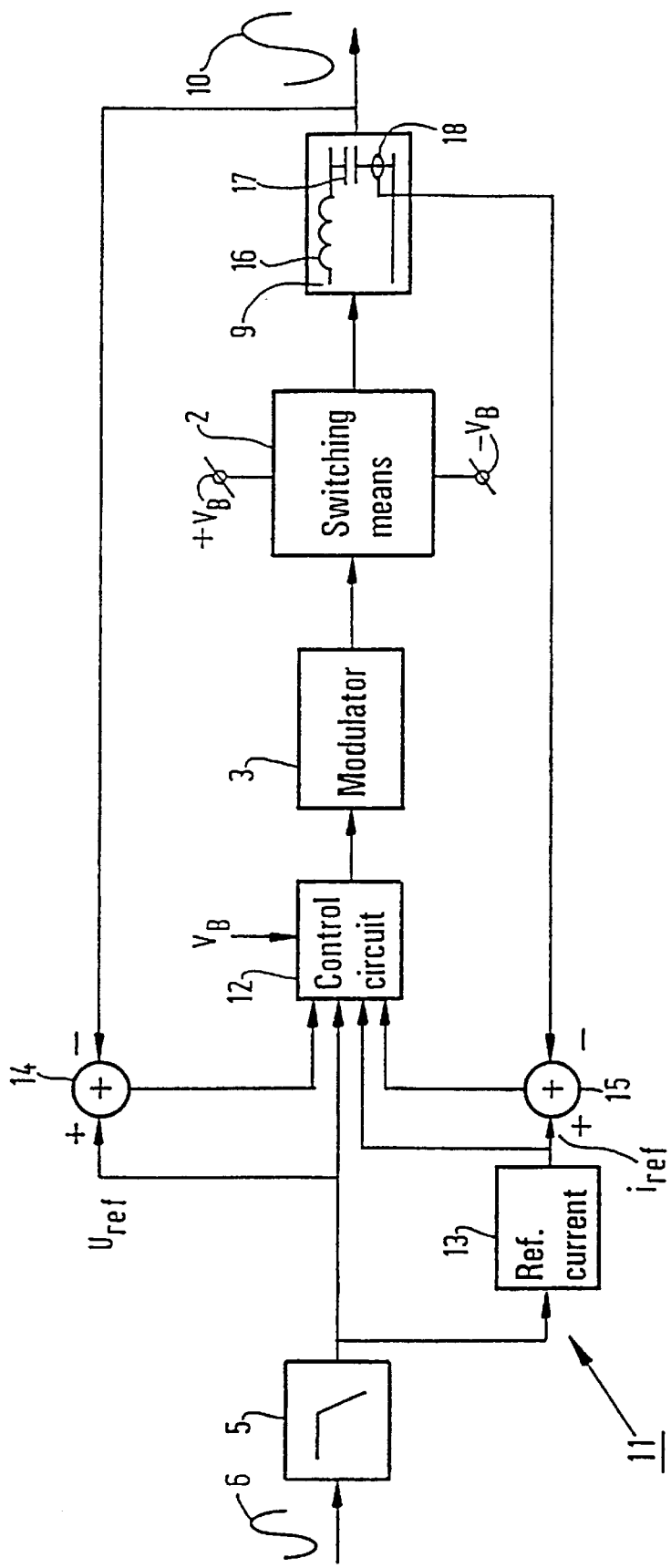
FIG. 2 is a block diagram wherein the amplifier circuit according to the invention is shown in its most general form.

FIG. 2 shows in a general block diagram the principle of an amplifier circuit according to the invention in its most extensive form, which comprises control means 12 for controlling the modulating means 3 on the basis of both a voltage correction signal and a current correction signal.

The voltage correction signal is formed in a first differential circuit 14 from a reference voltage $U_{ref}$ and an output voltage which is proportional to output signal 10. The reference voltage $U_{ref}$ is formed from the input signal 6 after filtering by the anti-aliasing input filter 5.

The current correction signal is formed in a second differential circuit 15 from a reference current $i_{ref}$ and a filter capacitance current 18 proportional to the current through the filter capacitance 17 of the output filter means 9. The reference current $i_{ref}$ is formed by means of a reference current providing circuit 13 from the input signal 6 filtered by the anti-aliasing input filter 5. In this embodiment the reference current providing circuit 13 comprises differentiating means.

As is shown in the block diagram of FIG. 2, besides the filtered input signal, the reference voltage $U_{ref}$, the reference current $i_{ref}$, the voltage correction signal and the current correction signal, also a signal proportional to supply voltage $V_B$ is applied to the control circuit 12 for equalizing interferences in the output signal 10 caused by supply voltage variations.

Since the current through filter capacitance 17 of the output filter means 9 is proportional to the differential of the voltage of the output signal 10, and reference current $i_{ref}$ is proportional to the differential of the voltage of the input signal 6, the differential circuit 14 supplies a current correction signal by means of which an adequate differential correction of (quick) disturbances in the output signal 10 can be effected. This results in an amplifier circuit having a high control stability, wherein changes in the load on the amplifier circuit are directly detected and corrected, so that the influence of the output filter means 9 on the output impedance of the amplifier circuit is hardly noticeable any more, which output impedance is only in the order of a few mΩ any more in a practical realisation of the amplifier circuit.

Figure 3:
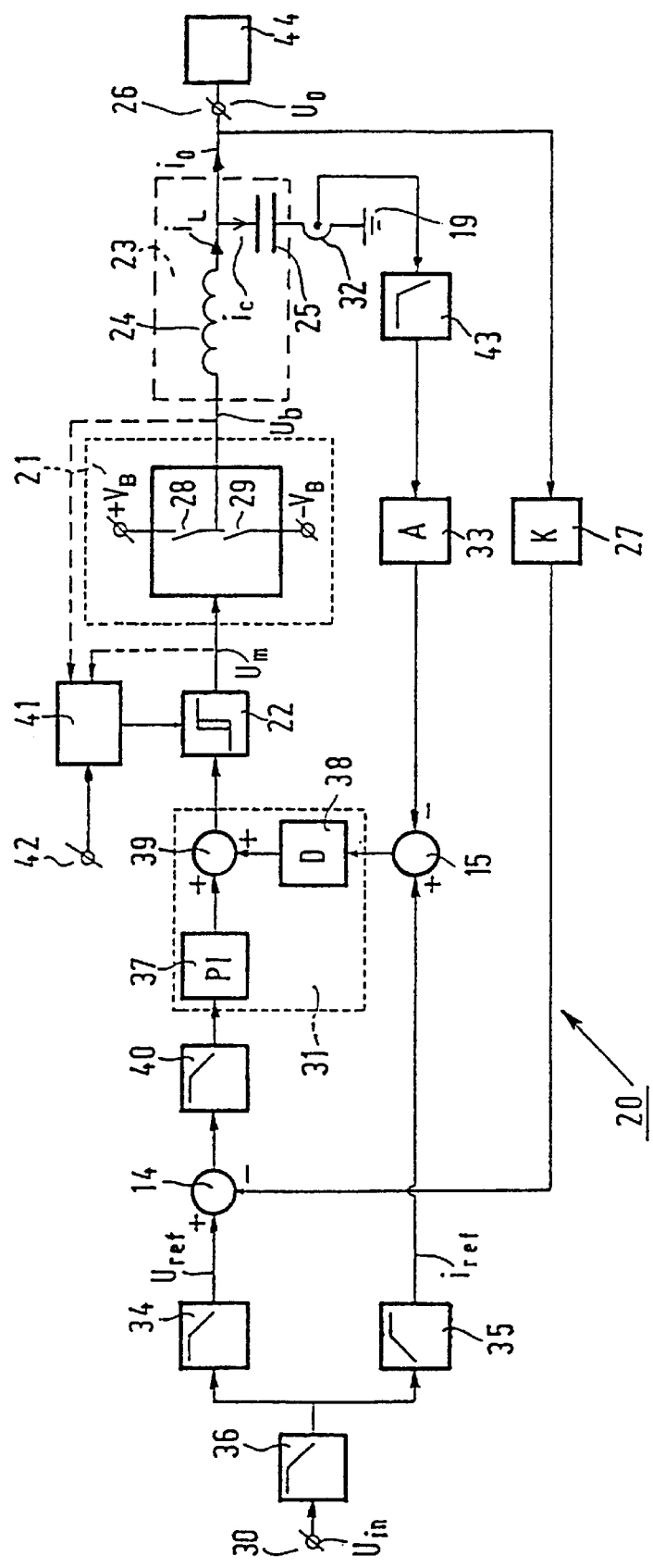
FIG. 3 is a block diagram which shows in more detail a first embodiment of the amplifier circuit according to the invention, which is configured as a so-called half-bridge circuit.

FIG. 3 shows in more detail in the form of a block diagram a first embodiment of an amplifier circuit 20 according to the invention, which comprises switching means 21 in the form of a half-bridge circuit, as is schematically shown by means of switches 28, 29. In practice the switches 28, 29 consist of switching transistors, such as MOSFET-type transistors.

The switching means 21 are controlled by modulating means 22, in this embodiment in the form of a Schmitt trigger circuit with variable hysteresis.

The output filter means 23 for filtering the block wave signal $U_b$ of the switching means 21 are in the form of a passive low pass filter comprising a self inductance or coil 24, one end of which is connected to switching means 21 for applying the block wave signal thereto, and the other end of which is connected to an output terminal 26 of the amplifier circuit 20. A filter capacitance in the form of a capacitor 25 is present between output terminal 26 and signal earth 19. In practice the filter capacity can be made up of several capacitors 25 which are connected in parallel.

From output terminal 26, part of the output signal voltage $U_o$ is returned to a first input of a first differential circuit 14 via attenuating means 27 having an (adjustable) attenuation factor K. A reference voltage $U_{ref}$ which has been derived via filter means 34 from the input signal $U_{in}$ applied to an input terminal 30 and low-pass filtered via anti-aliasing input filter means 36, is applied to a second input of the differential circuit 14.

The first differential circuit 14 produces from the signals being applied a first differential signal in the form of a voltage correction signal for the forming by control or correction means 31 of a control signal for the modulating means 22, which produce a signal $U_{in}$ for controlling the switching means 21.

In accordance with the invention, a filter capacitance current proportional to the current $i_c$ through the filter capacitance or capacitor 25 is measured, to which end the primary winding of a current transformer 32 is connected in series with the filter capacitor 25. The signal produced in the secondary winding of the current transformer 32 is applied to a first input of a second differential circuit 15 via wideband low pass filter means 43 and attenuating means 33 having an (adjustable) attenuation factor A. A reference current $i_{ref}$ derived from the input signal $U_{in}$ with the aid of differentiating means 35 is applied to a second input of the differential circuit 15. The second differential circuit 15 produces a current correction signal from the difference between the reference current $i_{ref}$ and the (attenuated) measured filter capacitance current $i_c$, which is the first order derivative from the output signal voltage $U_o$. The current correction signal is likewise applied to correction means 31 for controlling the modulating means 22.

In the embodiment which is shown in FIG. 3, the correction means 31 are in the form of a so-called PID (Proportionally Integrating Differentiating) controller, comprising a Proportionally Integrating (PI) control circuit 37, to which the voltage correction signal from the first differential circuit 14 is applied, after low pass filtering by filter means 40 and a control circuit 38, if desired, to which the difference between the differentiated input signal $U_{in}$ (the reference current $i_{ref}$) and the differentiated output signal $U_o$ (the measured filter capacitance current), in this case the current correction signal from the second differential circuit 15, is applied. In this embodiment the control circuit 38 provides only a proportional factor D to the difference between the derivatives of the signal voltages. The output signals from the PI control circuit 37 and the D control circuit 38 are summed by a summing circuit 39, and the summing signal is applied to the modulating means 22 as an input signal.

It is noted that instead of using a PID control circuit, it is possible in the simplest embodiment of the correction means 31 to use only a so-called proportional (P) control circuit. Because of their more optimal control characteristics, however, it is preferred to use a PI control circuit, and in particular a PID control circuit.

A hysteresis control circuit 41 is provided for varying the hysteresis window of the modulating means 22 (Schmitt trigger circuit), to an input 42 of which inter alia the reference signal $U_{ref}$, the supply voltage $V_B$ or a signal obtained on the basis of the measured switching frequency for the switching means 21 is applied.

In a preferred embodiment of the invention, also representations of the block wave signal $U_b$ from the switching means 21 and the output signal $U_{in}$ from the modulating means 22 are applied to the hysteresis control circuit 41 for varying the hysteresis window of the modulating means 22, as is schematically indicated by means of broken arrows.

Figure 4:
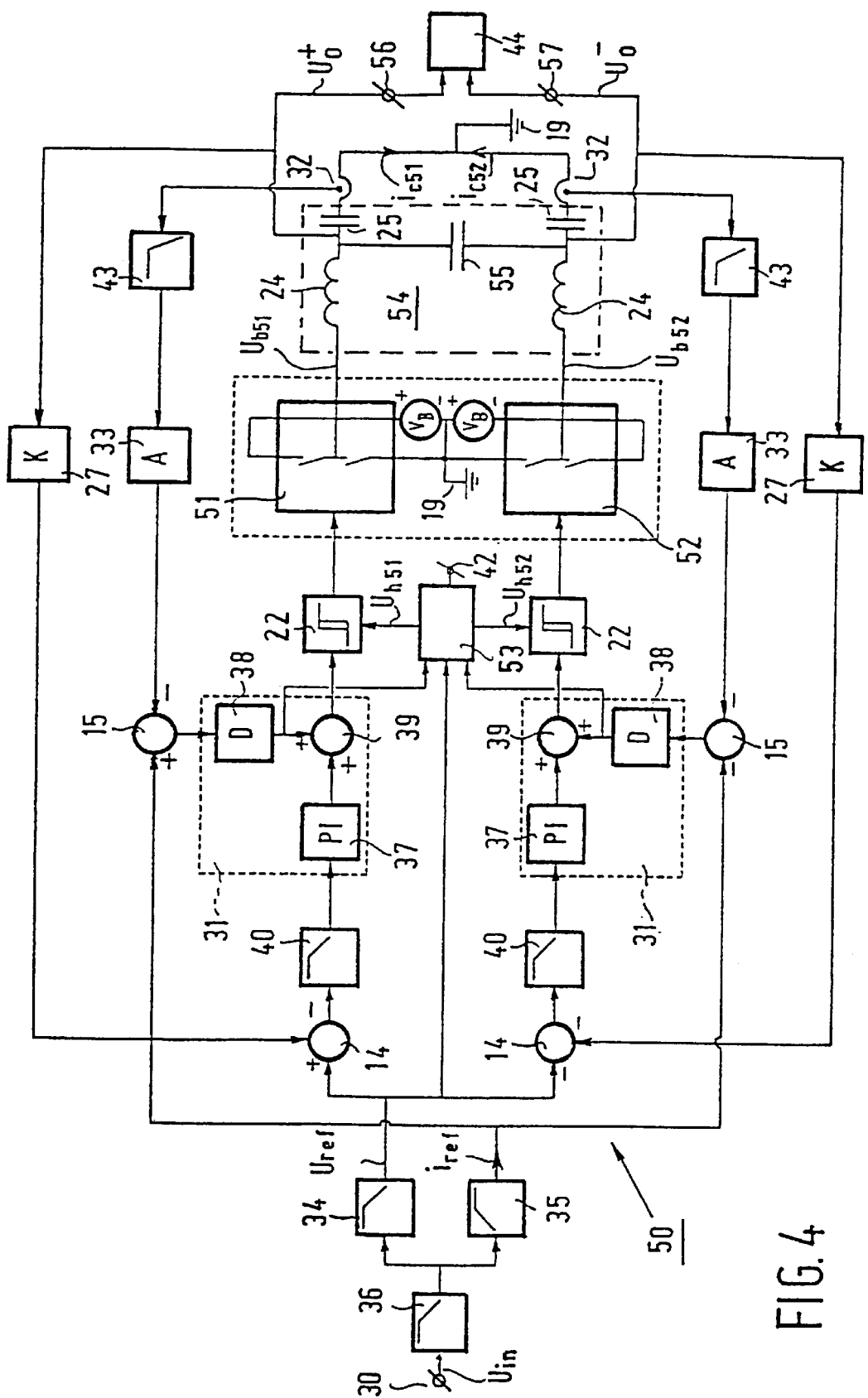
FIG. 4 is a block diagram of a second embodiment of the amplifier circuit according to the invention, which is configured as a so-called full-bridge or H-bridge circuit.
Figure 5:
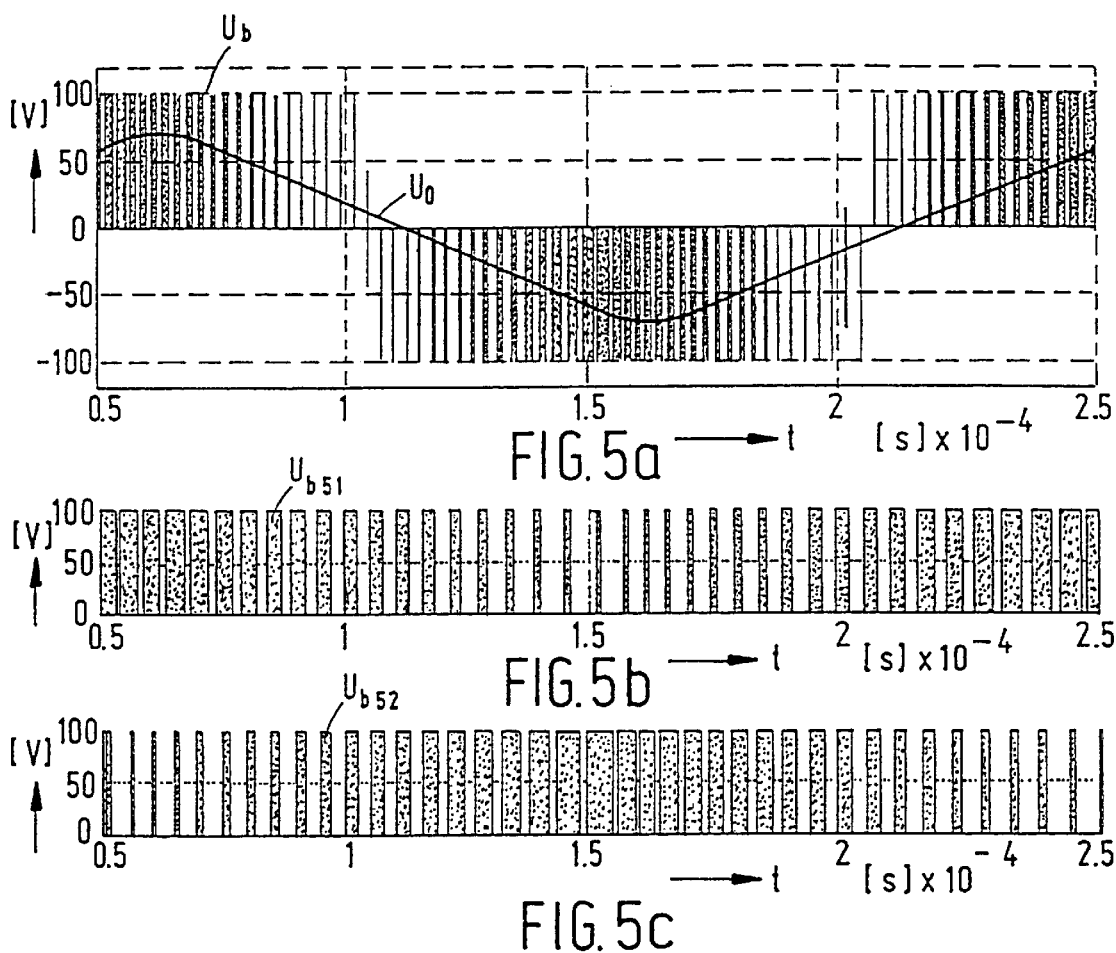
FIGS. 5–8 graphically show signal waveforms which are illustrative of the operation of the amplifier circuit according to the invention having the configuration as shown in FIG. 3 or 4.

A second embodiment of the amplifier circuit according to the invention in the form of a so-called full-bridge or H-bridge is shown in FIG. 4, wherein the amplifier circuit is indicated as a whole by reference numeral 50.

Amplifier circuit 50 comprises two sets of switching means 51, 52, which are configured in the same manner as the switching means 21 as described above with reference to FIG. 3.

A voltage correction signal and a current correction signal are derived for each of the switching means 51, 52 for controlling, via respective correction means 31, the modulating means 22 for each of the half-bridge branches. Both bridge branches 51, 52 in the block diagram of FIG. 4 process the entire input signal, albeit with opposite polarity.

The amplifier circuit is set so that the signals from the two bridge branches will compensate each other in the case of an input signal which equals zero, and that there will be no switching ripple in the output signal. In the case of an input signal which does not equal zero, the switching phase of the two bridge branches will be controlled such that there will be no difference in pulse width.

A common hysteresis control circuit 53 is provided for the two modulating means 22, which control circuit comprises inputs for the reference signal $U_{ref}$ and the two current correction signals via the D control circuit 38 of the respective correction means 31, and an input 42, if desired, for controlling the hysteresis window of the modulating means 22 in dependence on the supply voltage and/or the measured switching frequency, etc., as described with reference to FIG. 3.

In the illustrated embodiment the output filter means 54 comprise two coils 24, two filter capacitors 25 connected in series with a current transformer 32, and a further filter capacitor 55, connected as shown in FIG. 3, for low-pass filtering of the block wave signals $U_{b51}$ and $U_{b52}$ from the switching means 51 and 52, respectively.

The half output signal $U_o$, indicated $U_o$, is taken from output terminal 56, whilst the inverted half output signal $U_o$, respectively indicated $U_o$, is available at output terminal 57.

The operation of the circuits according to the invention will now be illustrated by means of the signal waveforms as shown in FIGS. 5–8.

During desired operation the following applies: $U_o=U_{ref}$. From this it follows for the current $i_c$ through the filter capacitor 25 having capacitance C:

$$i_c = C \frac{dU_0}{dt} \rightarrow i_{ref} = C \frac{dU_{ref}}{dt}$$

The current through the filter capacitor 25 is measured with a high bandwidth, typically in the order of five times the signal bandwidth of the amplifier circuit or higher, and preferably 2 MHz or higher.

The anti-aliasing input filter 36, which is for example a low pass filter having a bandwidth of 20 kHz when the amplifier circuit is used as an audio amplifier, reduces the bandwidth of the input signal $U_{in}$ to the operational bandwidth of the amplifier 20 and 50, respectively. FIG. 5a shows a graphic representation of the course in time t of the output signal $U_o$ and the block wave signal $U_b = U_{b51} - U_{b52}$ produced by the bridge circuits 21 and 51, respectively. The output signal $U_o$ in question is derived from a symmetric triangular input signal $U_{in}$ having a frequency of 5 kHz. The figure clearly shows that the waveform of the output signal $U_o$ is rounded as a result of the operation of the input filter 36, which rounds off sharp extreme values in the input signal $U_{in}$.

FIG. 5b shows the block wave signal $U_{b51}$ delivered by the bridge circuit 51 in FIG. 4, and FIG. 5c shows the block wave signal $U_{b52}$ produced by the bridge circuit 52 in FIG. 4 in response to the triangular input voltage $U_{in}$. In FIG. 4 the following applies for this example: $V_B=50$ V.

Figure 6:
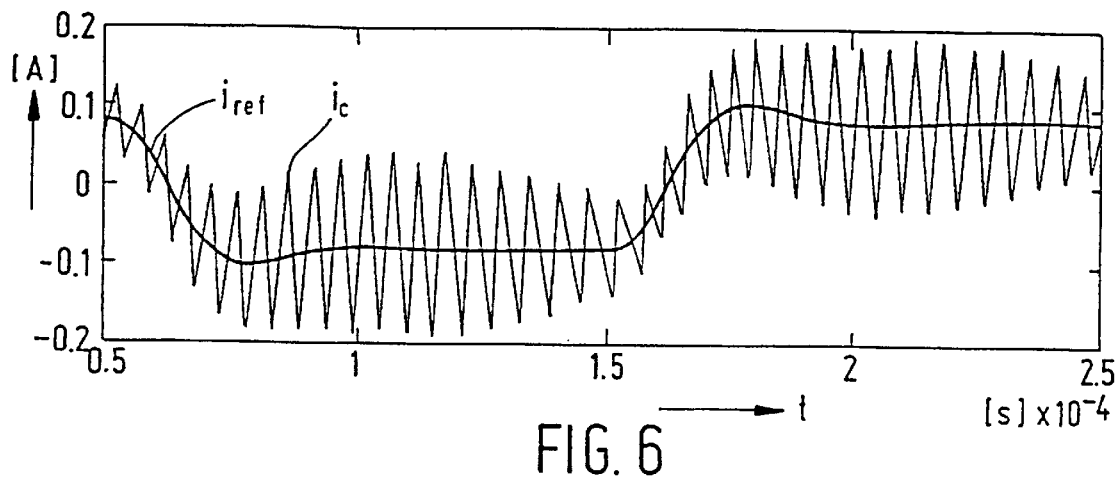

In the case of an approximately triangular input voltage $U_{in}$, the current $i_{ref}$ derived therefrom is roughly the derivative of a triangle, that is, a block wave with filtered edges as shown in FIG. 6. In addition to the scaled current $i_{ref}/A$, also the current $i_c$ through the filter capacitor 25 is indicated in this figure. The ripple in the current $i_c$ is caused by switching.

The difference between the reference current $i_{ref}$ and the filter capacity current $A.i_c$ is applied to the D control circuit 38 of the correction means 31 and forms an input signal of the hysteresis control circuit 53 of the modulating means 22. By controlling the hysteresis window of the modulating means 22 of the hysteresis control circuit 41 and 53, respectively, in dependence of for example the reference voltage $U_{ref}$, it is achieved that on average the effective switching frequency of the amplifier circuit remains practically constant, which is clearly shown in FIG. 6, because the cycle time between the flanks of $i_c$ remains substantially constant.

The reason for this is as follows. Since the voltage across the filter coil 24 becomes smaller in the case of a high degree output and positive values for $U_b$, the derivative di/dt of the coil current $i_L$ will decrease, whilst di/dt will become more negative in the case of a negative value for $U_b$. Accordingly, the time which is required for moving forwards and backwards between the two hysteresis limits will increase. When the hysteresis window remains constant, this will result in a frequency decrease.

It is noted that the switching frequency in the circuit according to the invention may vary in order to equalize interferences as quickly as possible (within one switching period), as will be explained in more detail hereafter.

Let us now consider the case in which the output load 44 of the amplifier circuit exhibits a step.

Figure 7A:
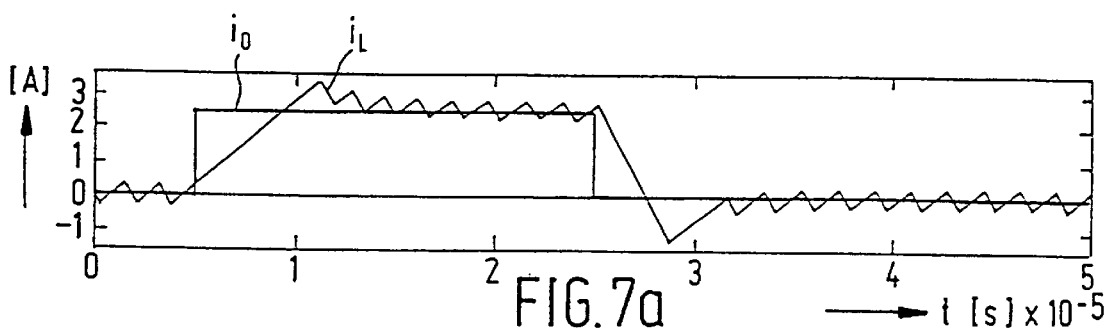

FIG. 7a shows a stepped increase in the current $i_o$ at a point in time $t=0.5\times 10^{-5}$ s, which continues until the point in time $t=2.5\times 10^{-5}$ s.

Figure 7B:
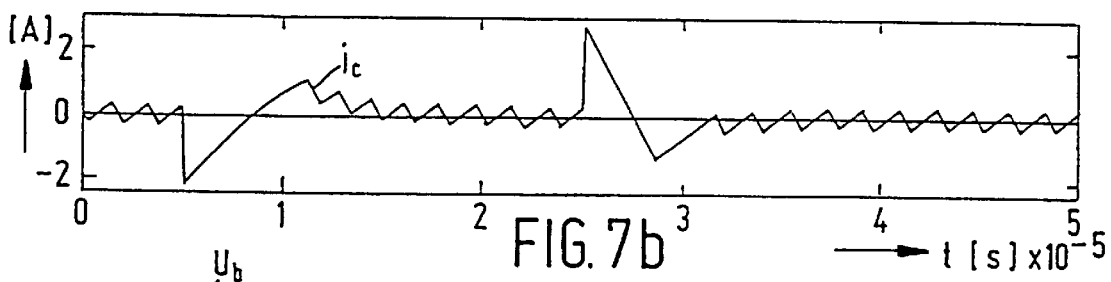

The higher current $i_o$ will be supplied directly from the output filter capacitor 25, as is clearly illustrated in FIG. 7b, whereby current $i_c$ exhibits a step upon turning on and off of current $i_o$. The current $i_L$ through the coil will follow more slowly, of course, as is shown in FIG. 7a. The ripple on current $i_L$ and $i_c$ is the switching ripple of the amplifier circuit in connection with the switching of the switching means 21 and 51, 52, respectively.

Figure 7C:
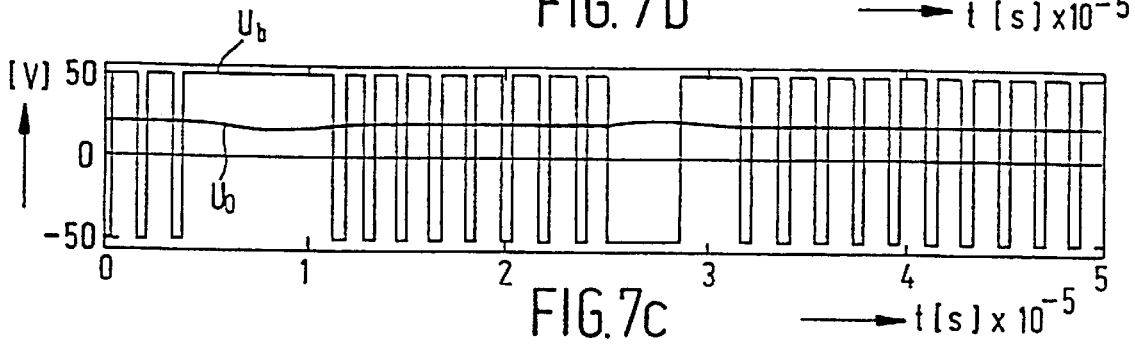

FIG. 7 shows that directly after the step in $i_c$ the pulse width of the block wave signal $U_b$ produced by the switching means is adapted via the correction means 31, that is, made longer so as to increase the current $i_L$ through the coil as quickly as possible. Or to decrease the current through the coil as quickly as possible, to zero in the example in question, upon switching off of $i_o$.

FIG. 7 clearly shows that the output voltage $U_o$ across the filter capacitor remains practically constant, whilst the distortions caused by the change in the load is in accordance with the invention removed within one switching period, because the switching frequency in the amplifier circuit according to the invention may vary, in contrast to the prior art wherein the switching frequency is maintained at a constant level by an oscillator present in the modulating means. An increased speed of response is obtained by dropping the principle of a fixed switching frequency, which makes it possible to realise a lower output impedance.

Figure 8A:
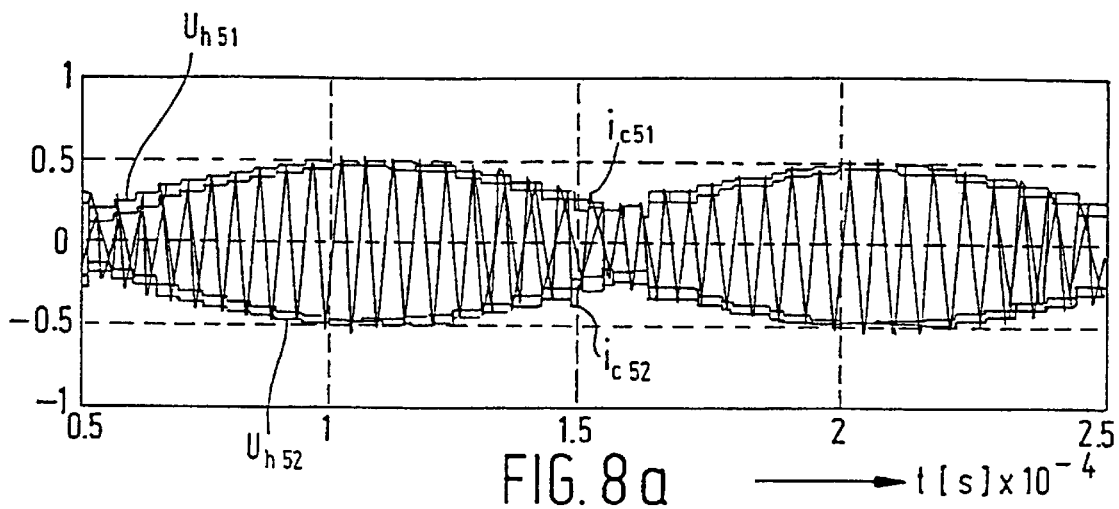

In FIG. 8 the operation of the modulator is shown more clearly yet. FIG. 8a shows the two control signals $U_{h51}$ and $U_{h52}$ for the hysteresis windows of the modulators 22 of the switching means 51 and 52, respectively (see FIG. 4). In the amplifier circuit which is shown in FIG. 4 the hysteresis windows for the modulating means 22 are controlled between the limits +0.5 and −0.5. The hysteresis control consists of a differential term and a common term. The differential term controls the desired phase difference between the two bridge branches 51, 52. The differential term functions to stabilise the average switching frequency, it is identical (in phase) for both branches 51, 52. The two terms operate entirely independently of each other, they can also operate autonomously.

When the modulation depth is large, the output voltage $U_o$ does not range centrally between the positive and the negative bridge voltage $V_b$. Because of this, the voltage across the coil 24 of the output filter 23 and/or 54 will be asymmetrical, as a result of which the rising and falling edges of the capacitor current $i_c$ will begin to differ from each other. The upper bridge branch comprising the switching means 51 in FIG. 4 receives the reference voltage $U_{ref}$, whilst the lower bridge branch comprising the switching means 52 receives $-U_{ref}$ as the reference voltage. Because of this, the capacitor currents $i_{c51}$ and $i_{c52}$ of the bridge branches 51 and 52, respectively, will exhibit opposite asymmetry, as is clearly shown on a larger scale in FIG. 8b. Also refer to FIG. 5a.

Figures 8B, 8C, 8D:
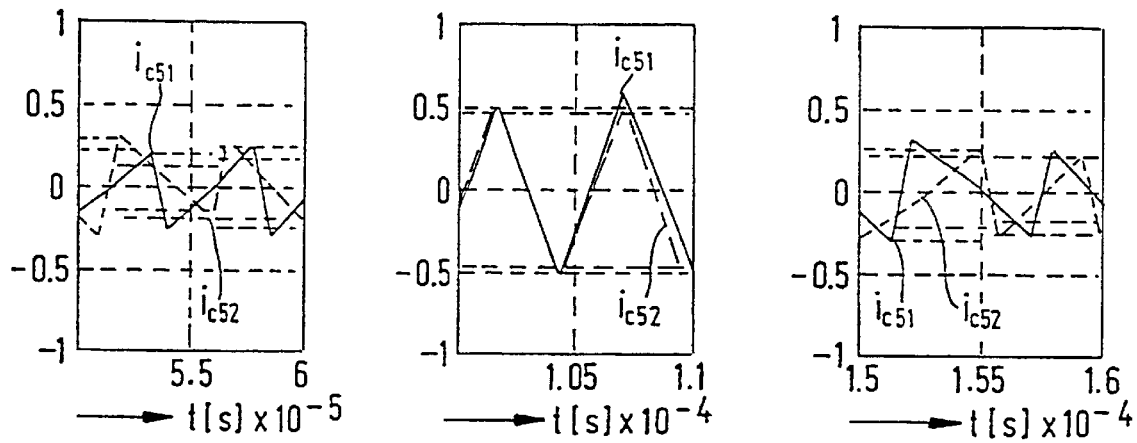

FIG. 8c shows the situation when $U_{ref} = 0$, wherein it applies that the ripples in the capacitor currents of the two bridge branches are the same.

FIG. 8d shows the capacitor currents at the lowermost point of the reference voltage $U_{ref}$, refer also to FIG. 5a.

The amplifier circuit according to the invention does not comprise a separate oscillator signal or oscillating means according to the prior art. The switching frequency adjusts itself on the basis of the current $i_c$ through the filter capacitance and the modulation of the hysteresis window, as explained above. As a result of this modulation, an average constant switching frequency is obtained. It is noted, however, that this is not a requirement for the operation of the window circuit.

It is noted that the values which are shown in the figures are merely illustrative values.

From the foregoing it will be understood that an effective and quick correction for load variations is provided by producing a current correction signal from the current through the filter capacitor, wherein the modulation of the hysteresis window of the modulating means prevents narrow pulses being applied to the switching means, which narrow pulses may cause damage to the switching means, in particular in the case of semiconductor switching means.

The provision of a filter capacitance current proportional to the filter capacitor of the output filters forms an important aspect of the present invention. Although an indirect measurement with a parallel capacitor and a series resistor is within the bounds of the possible, the invention also provides an RF current transformer, which can be directly connected in series with the filter capacitor 25. Such direct measurement will provide a more accurate representation of the filter capacitance current than an indirect measurement, of course.

Figure 9:
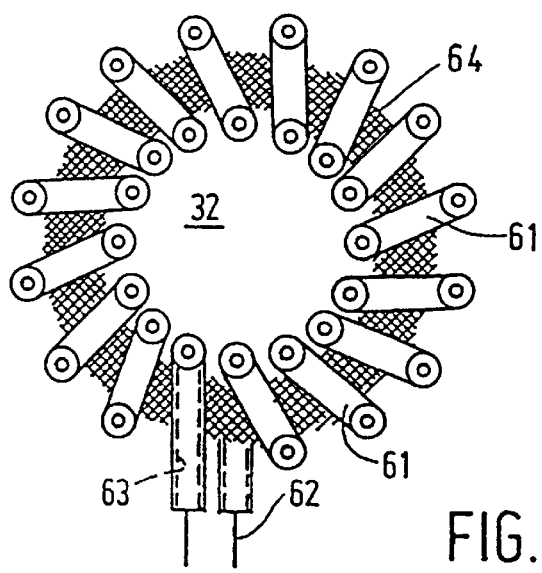
FIG. 9 shows a current transformer for use in the amplifier circuit according to the invention.

FIG. 9 is a sectional view of a preferred embodiment of the current transformer 32, wherein a coaxial cable 61 is wound round a toroidal core 64 of a material having high magnetic permeability. The coaxial cable 61 includes an inner conductor 62 and an outer conductor 63. Inner conductor 62 is preferably connected in series with the filter capacitor, whilst a current proportional to the filter capacitor current is generated in the coaxial outer conductor (screen) 63 with its relatively low ohmic resistance in comparison to the inner conductor. These connections can also be exchanged, of course.

When the current transformer 32 is accurately configured, capacitor current variations in the order of 2 MHz or higher can be measured and processed.

It is also possible to use cores other than toroidal cores 61, of course, such as an EE core (not shown), for example.

It has been found that in particular in the frequency range between 0–500 Hz variations in the filter capacitance are not so easy to detect. Accordingly, the voltage correction signal has to be optimally adjusted for variations in load 44 in this frequency range.

Figure 10:
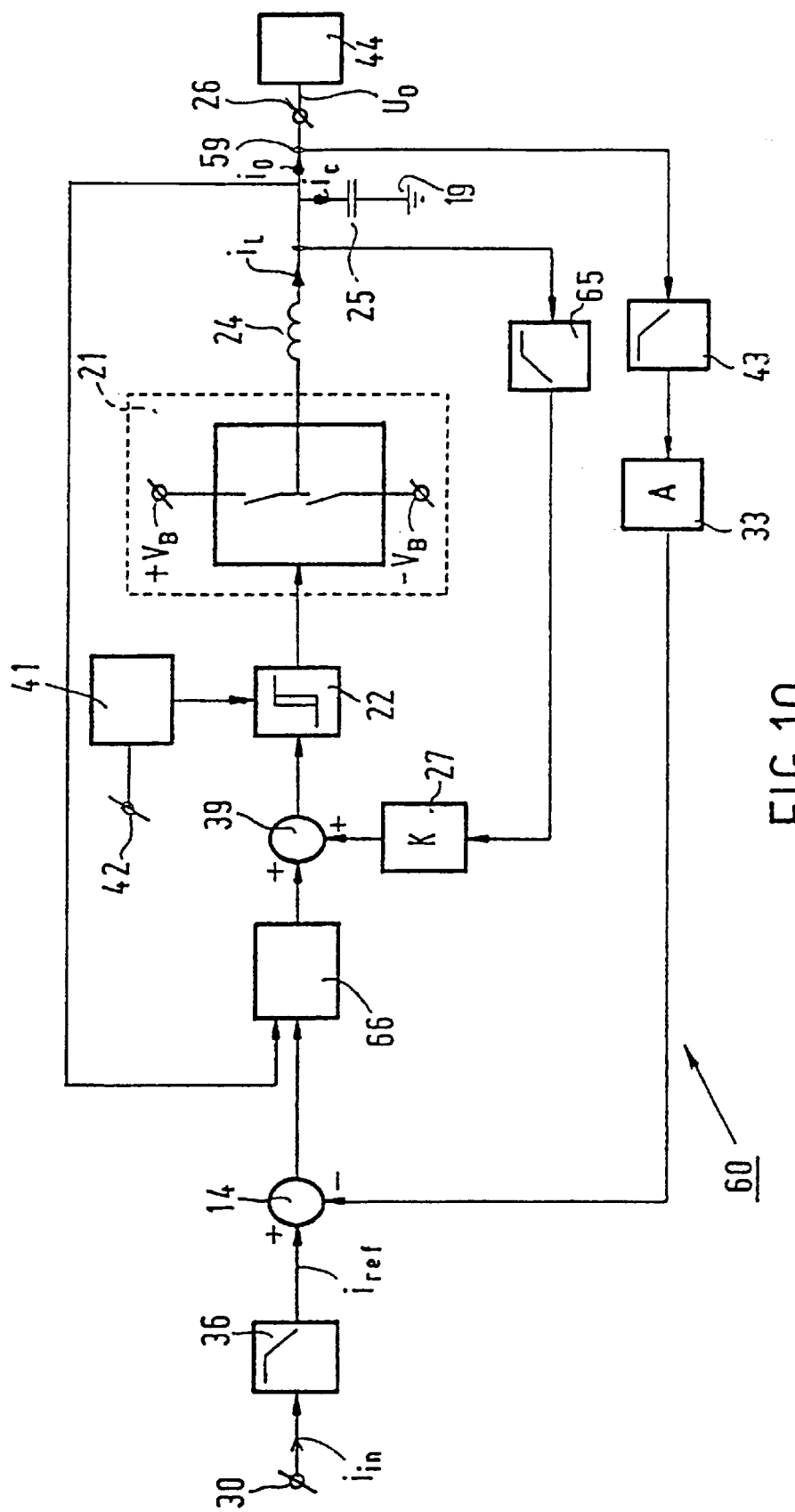
FIG. 10 is a block diagram which shows a preferred embodiment of the amplifier circuit according to the invention, which is configured as a so-called current amplifier.

Although the invention has been illustrated by means of preferred embodiments for an audio voltage amplifier, it can also be used in switching amplifiers or class D amplifiers for instrumentation and/or measurement and control purposes, such as servo amplifiers or power amplifiers having extremely high values for the product of power and bandwidth. Besides a voltage amplifier circuit, also a power amplifier circuit can be realised with the principle according to the invention. One possible embodiment is shown in FIG. 10. For a power amplifier 60, at least two of three currents, viz. the filter coil current $i_L$, the filter capacitance current $i_c$ or the output current $i_o$ must be measured. The most practical thing to do is to measure the current through coil $i_L$ and the output current $i_o$, as indicated by numerals 58 and 59, respectively. The current measuring means 58 and 59 may for example be configured as described above by means of the measurement of the filter capacitor current $i_c$. From the measured values of $i_L$ and $i_o$ follows a value proportional to filter capacitance current $i_c$.

In this embodiment the switching ripple is removed from the current $i_L$ through the coil 24 by means of a high pass filter 65, whose pass bandwidth is higher than the signal bandwidth. The measured output current $i_o$ is deducted from the reference value $i_{ref}$ which is formed from the input current $i_{in}$. The difference current is processed by control circuit 66 into a correction on the input signal of the modulating means 22. In order to have the system function in a controlled manner for all possible loads, among which inductive loads, additional feedback of the output voltage $U_o$, in this case the voltage across the filter capacitor 25, is required, as is shown in the drawing by means of feedback to control circuit 66.

Although this is not shown in the figures, a person skilled in the art can absolutely use the invention with the so-called H-bridge circuit with complementary mode controlled bridge branches, which circuit is also comprised by the claims.

Figure 11:
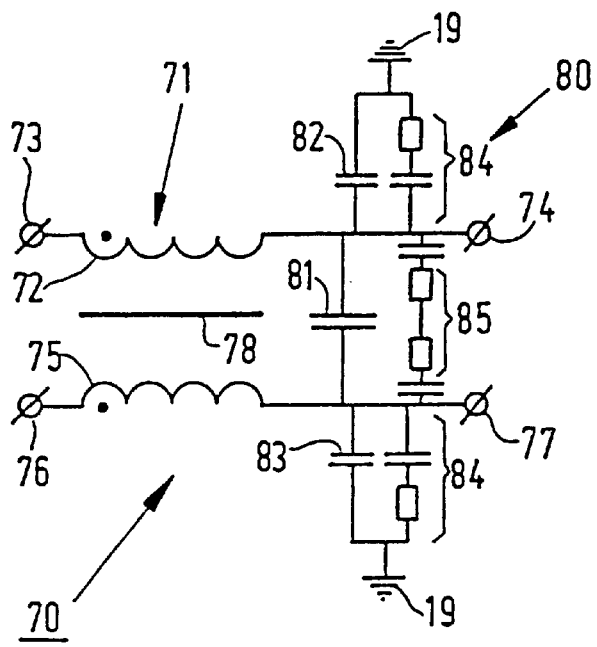
FIG. 11 is a block diagram which shows a preferred embodiment of a passive output filter for use in a full-bridge or H-bridge circuit according to the invention.

FIG. 11 schematically shows a preferred embodiment of a passive output filter for use with a full-bridge or H-bridge circuit, as for example shown in FIG. 4. The passive output filter 70 comprises a filter inductance 71 and a filter capacitance 80.

The filter inductance 71 comprises a first capacitor 81 connected between the terminals 74, 77 of filter coils 72 and 75, respectively, which capacitor will in practice consist of several capacitors which are connected in parallel.

Figure 12:
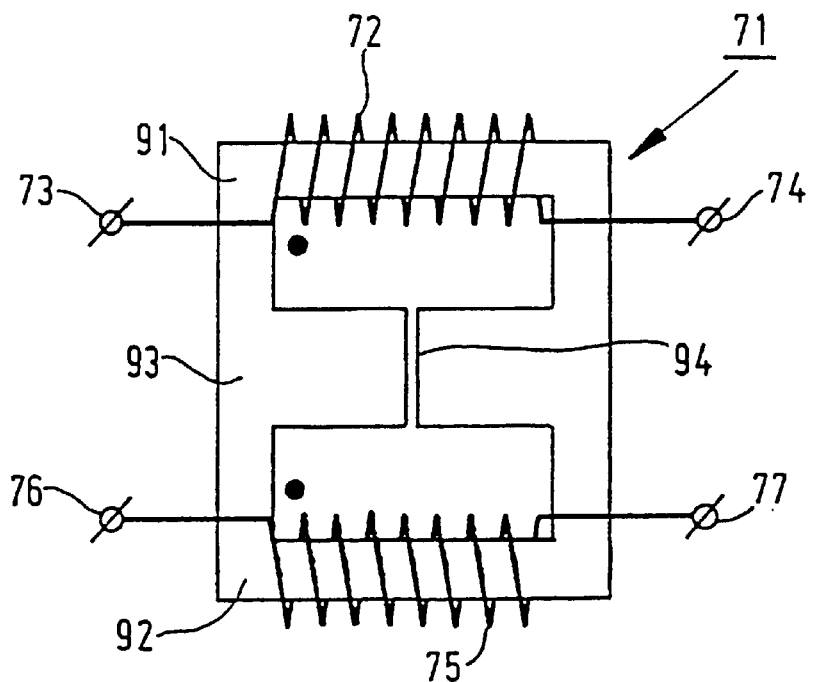
FIG. 12 shows an implementation of the filter coil for the output filter of FIG. 11.

Filter capacitance 80 furthermore comprises a second capacitor connected between the terminal 74 of the first filter coil 72 and signal earth 19, and a third capacitor 83 connected between the terminal 77 of the second filter coil 75 and signal earth 19. Furthermore a series circuit 84 comprising a capacitor and a resistor is connected in parallel to capacitors 82 and 83. Two series-connected series circuits 84, jointly indicated by numeral 85, are connected in parallel to capacitor 81. Said series circuit 85 forms a current measuring branch for measuring therein a current proportional to the current through capacitor 81. Series circuits 84 function to compensate and damp in-phase or "common-mode" signals at terminals 73 and 76 of the first filter coil 72 and the second filter coil 75, respectively. Filter coils 72 and 75 are furthermore magnetically coupled in such a manner that common-mode signals on the terminals 73, 75 are attenuated. Refer to FIG. 12 in this connection.

The magnetic coupling 78 between the filter coils 72, 75 is made up of an essentially 8-shaped core 90 having a first outer leg 91, a second outer leg 92 and a central leg 93. First outer leg 91 has the first filter coil 72 wound thereon, and second outer leg 92 has the second filter coil 75 wound thereon, as is shown in the figure. The magnetic resistance of the central leg 93 is greater than that of the two outer legs 91, 92, for example as a result of the presence of an air gap 94 formed in the central leg. The core 90 can advantageously be formed of ferrite.

The filter coils 72 and 75 are wound in such a manner that an in-phase or common mode signal at the terminals 73, 76 will produce a magnetic field in the core 90, which extends via the outer legs 91, 92 and the connecting pieces therebetween. Because of this arrangement, the filter coil 70 has a very low inductance for common-mode signals on the terminals 73, 76. Reverse phase or differential signals on the terminals 73, 76, however, produce a magnetic field extending through the central leg 93 which has a relatively high magnetic resistance, so that the filter coil 70 indeed represents a high inductance for reverse phase signals and effects, together with filter capacitance 80, adequate filtering of the output signal produced by the amplifier.

Figure 13:
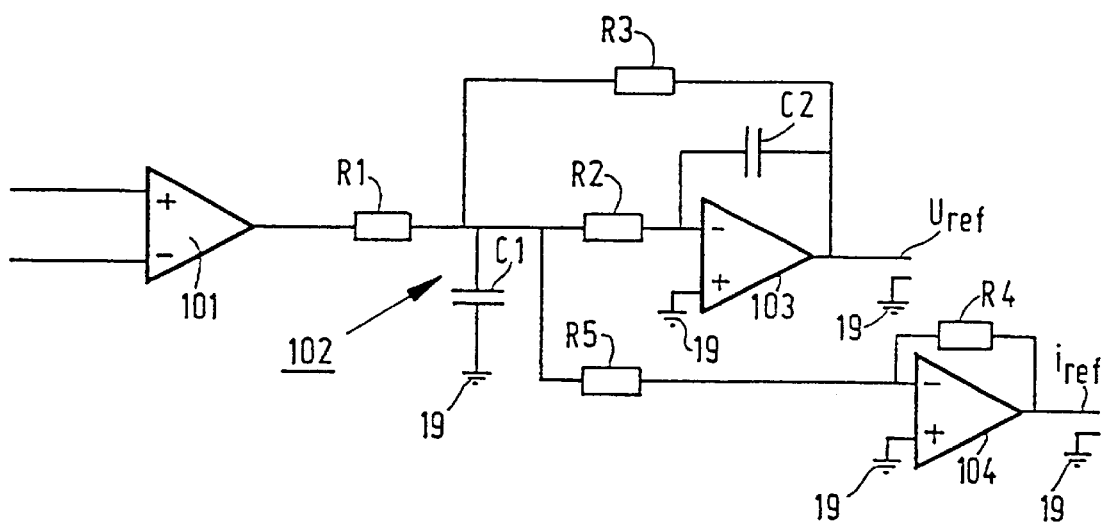
FIG. 13 is a block diagram which shows a preferred embodiment of a combined input filter/reference current providing means for use in the amplifier circuit according to the invention.

FIG. 13 shows a block diagram of a preferred embodiment of a combined circuit of the anti-aliasing input filter 36 and the filters 34, 35 as shown in FIG. 3 and FIG. 4.

The combined circuit 100 comprises a first differential amplifier 101, to which the input signal from the amplifier circuit is applied. Connected between the output of differential amplifier 101 and signal earth 19 is a resistive/capacitive R1/C1 low pass filter 102.

Connected to low pass filter 102 is a second, integrator-connected differential amplifier 103, which includes resistors R2, R3 and a capacitance C2, as shown in FIG. 13.

The first differential amplifier 101 with the low pass filter 102 and the integrator-connected second differential amplifier 103 together form a second order low pass filter, wherein the reference voltage $U_{ref}$ is generated at the output of the second differential amplifier 103.

A third differential amplifier 104 including an attenuation defined by resistors R4 and R5 is connected to the first low pass filter 102, and provides at its output an output signal proportional to the voltage across the capacitance C1 of the low pass filter 102, that is, the differential of the input signal as reference current $i_{ref}$.

This combined reference voltage/reference current circuit possesses more favourable noise characteristics than for example a combination of separate filters 34, 35, 36.

As already indicated in the foregoing, the amplifier circuit according to the invention has a very low output impedance. In a simple first embodiment of an audio amplifier circuit according to the invention, the measured output impedance was less than 0.002 Ω at a frequency of 0–1 kHz, 0.0034 Ω at a frequency of 10 kHz and 0.017 Ω at a frequency of 20 kHz. A person skilled in the art will understand that such output impedances have not been realised with the so-called class D amplifier circuits that are known from the prior art.

What is claimed is:

1. An amplifier circuit for amplifying electric signals comprising controllable switching means for generating a block wave signal whose amplitude varies between first and second supply voltage values during operation, filter means for filtering said block wave signal so as to produce an output signal, said filter means comprise a selfinductance and a capacitance, means for providing a filter capacitance current proportional to a current through said filter capacitance, modulating means for pulse width modulation of said block wave signal by driving said switching means in response to an input signal to be amplified, and correction means for providing from a reference value derived from said input signal and an output signal value proportional to said output signal a correction signal for controlling said modulating means, and means for deriving a reference current from said input signal, wherein said correction means are arranged for providing said correction signal as a current correction signal from said reference current and said filter capacitance current.

2. An amplifier circuit according to claim 1, wherein said means for providing said filter capacitance current are configured to comprise a bandwidth in the order of at least five times a signal bandwidth of said amplifier circuit.

3. An amplifier circuit according to claim 2, wherein said means for providing said filter capacitance current comprise a bandwidth in the order of at least 2 Hz.

4. An amplifier circuit according to claim 1, wherein said means for providing said reference current comprise differentiating means.

5. An amplifier circuit according to claim 1, wherein said means for providing said filter capacitance current comprise a current transformer which is connected in series with at least part of said filter capacitance.

6. An amplifier circuit according to claim 5, wherein said current transformer is built up of a core having a coaxial cable wound thereon, one conductor of which is connected in series with said filter capacitance, whilst a filter capacitance current proportional to said current through said filter capacitance during operation is generated in another conductor of said coaxial cable.

7. An amplifier circuit according to claim 6, wherein said coaxial cable includes an inner conductor and an outer conductor surrounding said inner conductor, and wherein said inner conductor is connected in series with at least part of said filter capacitance.

8. An amplifier circuit according to claim 6, wherein said core is toroidal.

9. An amplifier circuit according to claim 1, wherein said correction means are arranged for providing, from a reference voltage derived from said input signal and an output voltage signal proportional to said output signal, said correction signal as a current and voltage correction signal for controlling said modulating means.

10. An amplifier circuit according to claim 9, wherein said correction means comprise a first differential circuit for providing a first difference signal from said reference voltage and said output voltage signal, a second differential circuit for providing a second difference signal from said reference current and said filter capacitance current, a Proportional (P) control circuit including an input for said first difference signal, a control circuit including an input for processing said second difference signal by a factor (D) and a summing circuit for summing an output signal of said P-control circuit and an output signal of said D-control circuit for controlling said modulating means.

11. An amplifier circuit according to claim 9, wherein said correction means comprise a first differential circuit for providing a first difference signal from said reference voltage and said output voltage signal, a second differential circuit for providing a second difference signal from said reference current and said filter capacitance current, a Proportionally Integrating (PI)-control circuit including an input for said first difference signal, a control circuit including an input for processing said second difference signal by a factor (D) and a summing circuit for summing an output signal of said PI control circuit and an output signal of said D-control circuit for controlling said modulating means.

12. An amplifier circuit according to claim 1, comprising means for providing a filter selfinductance current proportional to said current through said filter selfinductance, means for providing an output current signal proportional to said output signal current, wherein said correction means comprise a first differential circuit for providing a first difference signal from said reference current and said output current signal, a control circuit including an input for said first difference signal and an input for an output voltage signal proportional to said output signal voltage, and a summing circuit for summing an output signal of said control circuit and a current value proportional to said filter selfinductance current for controlling said modulating means.

13. An amplifier circuit according to claim 1, wherein said modulating means comprises a hysteresis control circuit.

14. An amplifier circuit according to claim 13, wherein said hysteresis control circuit includes a controllable hysteresis window comprising a control input for controlling said hysteresis window.

15. An amplifier circuit according to claim 1, comprising filter for bandwith limiting said input signal for deriving therefrom said reference current.

16. An amplifier circuit according to claim 15, wherein said means for providing said reference current comprise differentiating means, said differentiating means and said filter means are combined into a single circuit comprising a first differential amplifier including an input for connecting said input signal of said amplifier circuit and an output to which a low pass filter is connected, a second differential amplifier connected in cascade with said low pass filter as an integrator including an output for supplying said reference voltage, and a third differential amplifier connected to said low pass filter for providing said reference current.

17. An amplifier circuit according to claim 1, wherein said controllable switching means comprise a series circuit of a first and a second switching transistor forming a half-bridge circuit, wherein said output signal of said bridge circuit is generated at a junction of said first and said second switching transistor.

18. An amplifier circuit according to claim 1, wherein said controllable switching means comprise a first series circuit of a first and a second switching transistor forming of a first half-bridge circuit, and a series circuit of a third and a fourth switching transistor forming a second half-bridge circuit, which first and second half-bridge circuits are connected as a full-bridge circuit and said output signal of said full-bridge circuit being generated at a junction of said first and said second switching transistor and a junction of said third and said fourth switching transistor.

19. An amplifier circuit according to claim 18, wherein said first half-bridge circuit is connected to a first amplifier circuit and said second half-bridge circuit is connected to a second amplifier circuit, wherein said reference current is applied to said second amplifier circuit in reverse phase compared to said first amplifier circuit.

20. An amplifier circuit according to claim 19, wherein a common hysteresis control circuit comprising a first and a second hysteresis window is provided for said first and second amplifier circuit.

21. An amplifier circuit according to claim 20, wherein said hysteresis control circuit is controlled by means of a control signal comprising a differential term and a common term, wherein said differential term controls a desired phase difference between said first and said second amplifier circuit and said common term controls an average switching frequency of said first and said second amplifier circuit.

22. An amplifier circuit according to claim 18, wherein said filter means for filtering said block wave signal of said full-bridge circuit comprise a selfinductance built up of an essentially 8-shaped core having a first and a second outer leg, each provided with a winding, and a central leg, which central leg, has a higher magnetic resistance than said two outer legs, wherein said winding on said first outer leg is connected to said junction of said first and said second switching transistor and said winding on said second outer leg is connected to said junction of said third and fourth switching transistor, in such a manner that an in-phase or common mode signal from said bridge circuit generated a magnetic field in said two outer legs of said core and in that a reverse phase signal from said bridge circuit generated a magnetic field through said central leg.

23. An amplifier circuit according to claim 22, wherein said ends of said windings which are not connected to said bridge circuit are each connected to signal earth via a parallel circuit consisting of a capacitor and a series connected capacitor and resistor, at least one capacitor being connected between said ends, which capacitor forms said capacitance of said filter means, and a current measuring branch being connected between said two ends, which current measuring branch consists of a first series circuit of a resistor and a capacitor and a second series circuit of a resistor and a capacitor for providing a filter capacitance current proportional to said current through said filter capacitance.

24. An audio amplifier having an amplifier circuit for amplifying electric signals, comprising controllable switching means for generating a block wave signal whose amplitude varies between first and second supply voltage values during operation, filter means for filtering said block wave signal so as to produce an output signal, said filter means comprise a selfinductance and a capacitance, means for providing a filter capacitance current proportional to a current through said filter capacitance, modulating means for pulse width modulation of said block wave signal to be amplified, and correction means for providing from a reference value derived from said input signal and an output signal value proportional to said output signal a correction signal for controlling said modulating means, and means for deriving a reference current from said input signal, wherein said correction means are arranged for providing said correction signal as a current correction signal from said reference current and said filter capacitance current.

25. A power amplifier having an amplifier circuit for amplifying electric signals, comprising controllable switching means for generating a block wave signal whose amplitude varies between first and a second supply voltage values during operation, filter means for filtering said block wave signal so as to produce an output signal, said filter means comprise a selfinductance and a capacitance, means for providing a filter capacitance current proportional to a current through said filter capacitance, modulating means for pulse width modulation of said block wave signal by driving said switching means in response to an input signal to be amplified, and correction means for providing from a reference value derived from said input signal and an output signal value proportional to said output to said output signal a correction signal for controlling said modulating means, and means for deriving a reference current from said input signal, wherein said correction means are arranged for providing said correction signal as a current correction signal from said reference current and said filter capacitance current.

* * * * *

UNITED STATES PATENT AND TRADEMARK OFFICE
CERTIFICATE OF CORRECTION

PATENT NO.    : 6,552,606 B1
DATED         : April 22, 2003
INVENTOR(S)   : Andre Velma et al.

It is certified that error appears in the above-identified patent and that said Letters Patent is hereby corrected as shown below:

Title page,
Item [57], ABSTRACT,
Delete the ABSTRACT in its entirety and substitute therefore:

--An amplifier circuit for amplifying electric signals, including a controllable switching device for generating a block wave signal whose amplitude varies between first and second supply voltage values during operation, a filter device for filtering the block wave signal so as to produce an output signal. The filter device includes a self-inductance and a capacitance. The amplifier circuit furthermore includes a modulating device for pulse width modulation of the block wave signal by driving the switching device in response to an input signal to be amplified, and a correction device for providing from a reference value ($U_{ref}$) derived from the input signal and an output signal value proportional to the output signal a correction signal for controlling the modulating device. To correct for interferences in the output signal, a device is provided for deriving a reference current ($I_{ref}$) from the input signal as well as a device for providing a filter capacitance current proportional to the current through the filter capacitance. The correction device is arranged for providing a current correction signal from the reference current ($I_{ref}$) and the filter capacitance current.--.

Column 17,
Line 31, before "filter", insert -- an input --.

Signed and Sealed this

Twenty-third Day of September, 2003

JAMES E. ROGAN
*Director of the United States Patent and Trademark Office*